(12) United States Patent
Liaw

(10) Patent No.: US 7,203,112 B2
(45) Date of Patent: Apr. 10, 2007

(54) MULTIPLE STAGE METHOD AND SYSTEM FOR SENSING OUTPUTS FROM MEMORY CELLS

(75) Inventor: Jhon Jhy Liaw, Hsin-Chu (TW)

(73) Assignee: Taiwan Semiconductor Manufacturing Co., Ltd., Hsin-chu (TW)

( * ) Notice: Subject to any disclaimer, the term of this patent is extended or adjusted under 35 U.S.C. 154(b) by 26 days.

(21) Appl. No.: 11/150,014

(22) Filed: Jun. 10, 2005

(65) Prior Publication Data

US 2006/0028889 A1 Feb. 9, 2006

Related U.S. Application Data

(60) Provisional application No. 60/599,004, filed on Aug. 5, 2004.

(51) Int. Cl.
*G11C 7/06* (2006.01)
(52) U.S. Cl. .................. 365/209; 365/158; 365/189.07
(58) Field of Classification Search ................ 365/209
See application file for complete search history.

(56) References Cited

U.S. PATENT DOCUMENTS 6,469,929 B1 * 10/2002 Kushnarenko et al. . 365/185.06
6,490,192 B2 * 12/2002 Thewes et al. ............. 365/158
6,845,052 B1 * 1/2005 Ho et al. .................... 365/210

* cited by examiner

*Primary Examiner*—Tan T. Nguyen
(74) *Attorney, Agent, or Firm*—Kirkpatrick & Lockhart Preston Gates & Ellis LLP

(57) ABSTRACT

A method or circuit is disclosed for sensing an output of a predetermined memory cell having a high resistance state or a low resistance state. A predefined voltage is applied to the predetermined memory cell to generate an output current reflecting a resistance of the predetermined memory cell, and to one or more reference memory cells to generate a first reference current reflecting the high resistance state, and a second reference current reflecting the low resistance state. A first differential value is provided to represent the difference between the output current and the first reference current. A second differential value is provided to represent the difference between the output current and second reference current. The first differential value with the second differential value to generate a digital output representing the resistance state of the predetermined memory cell.

10 Claims, 5 Drawing Sheets

US 7,203,112 B2

MULTIPLE STAGE METHOD AND SYSTEM FOR SENSING OUTPUTS FROM MEMORY CELLS

The present invention claims priority to U.S. Provisional Patent Application No. 60/599,004 filed Aug. 5, 2004 entitled "Multiple Stage Method And System For Sensing Outputs From A Memory Cell."

BACKGROUND

The present invention relates generally to integrated circuit designs, and more particularly to methods and systems for improving a sense margin when reading data from memory cells.

Magneto-resistive random access memory (MRAM) that uses magnetic components is becoming one of the most popular technologies for storing data bits. Instead of using electrical charges, as typically used in memory modules such as dynamic random access memory (DRAM) and static random access memory (SRAM), MRAM uses magnetic charges to store data bits. Unlike DRAM and SRAM, MRAM is a non-volatile device that does not require a constant electrical power to retain stored information. MRAM is therefore especially appealing in portable applications, such as mobile computer devices, that typically have a limited power supply.

A MRAM cell stores a data bit by being programmed in a high or low resistance state. Conventionally, methods for reading MRAM cells use only one sense amplifier to compare the output current from a predetermined MRAM cell with the reference current from a pair of reference MRAM cells. One of the reference MRAM cells is programmed to have a high resistance while the other is programmed to have a low resistance. A predefined voltage will apply to the predetermined MRAM cell to generate the output current, and the reference MRAM cells to generate the reference currents. The reference currents are averaged and then compared with the output current. If the output current is greater than the average reference current, the sense amplifier will output a logic "1" (or logic "0") signal.

This conventional method provides a rather limited sense margin when comparing the output current with the reference current. If an output current significantly deviates from its normal state, a sensing failure may occur. Thus, improved designs that increase the sense margin are therefore desired.

SUMMARY

The invention discloses a sensing circuit and method with an increases sense margin for sensing an output of a predetermined memory cell capable of switching between a high resistance state and a low resistance state. In one method embodiment, a predefined voltage is applied to the predetermined memory cell to generate an output current reflecting a resistance of the predetermined memory cell, and to one or more reference memory cells to generate a first reference current reflecting the high resistance state, and a second reference current reflecting the low resistance state. A first differential value is provided to represent the difference between the output current and the first reference current. A second differential value is provided to represent the difference between the output current and second reference current. The first and second differential values are compared to provide a digital output representing the resistance state of the predetermined memory cell.

In another embodiment, a circuit is disclosed for sensing an output of a predetermined memory cell capable of switching between a high resistance state and a low resistance state. The circuit includes one or more reference memory cells coupled to the predetermined memory cell. A voltage supply applies a predefined voltage to the predetermined memory cell to generate an output current reflecting a resistance of the predetermined memory cell, and the reference memory cells to generate a first reference current reflecting the high resistance state, and a second reference current reflecting the low resistance state. A set of one or more differential amplifiers coupled to the predetermined memory cell and the reference memory cells provide a first differential value representing the difference between the output current and the first reference current, and a second differential value representing the difference between the output current and second reference current. At least a sense amplifier coupled to the differential amplifiers compares the first differential value with the second differential value to generate a digital output representing the resistance state of the predetermined memory cell.

DESCRIPTION

Figure 1:
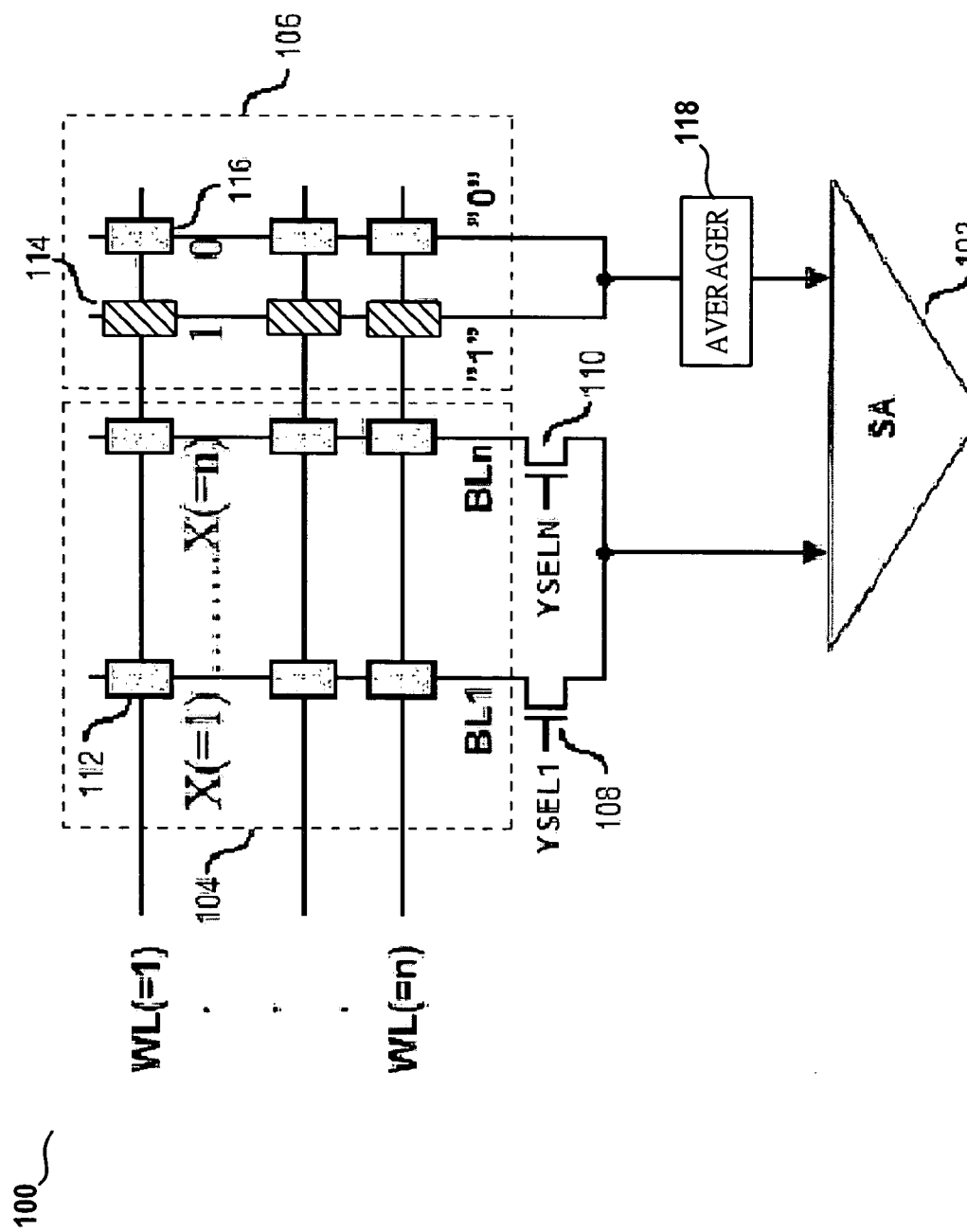
FIG. 1 illustrates a conventional sensing circuit.

FIG. 1 illustrates a conventional sensing circuit 100. A sense amplifier 102 is coupled to an averager 118 and a memory array 104 that has a plurality of MRAM cells. The averager 118 is further coupled to a reference array 106 that has a plurality of reference MRAM cells. The rows of the MRAM cells in the memory array 104 are defined by the word lines WL1 . . . WLn. For each word line WL, the reference array 106 includes at least one reference MRAM cell programmed to "1" and at least one reference MRAM cell programmed to "0." The columns of the MRAM cells in the memory array 104 are defined by the bit lines BL1 . . . BLn. The column of a predetermined MRAM cell in the memory array 104 can be selected with a selection signal on one of the Y-select lines, YSEL1 . . . YSELN, which control select devices, such as NMOS devices 108 and 110.

Each memory cell can be programmed to a high resistance state ($R_{high}$) or a low resistance state ($R_{low}$), which represent a logic "1" or "0," or vice versa. At least one reference MRAM cell is programmed to the high resistance state ($R_{high}$) representing, for example, a corresponding logic "1." At least one reference MRAM cell is programmed to the low resistance ($R_{low}$) state representing, for example, a corresponding logic "0." During the reading process, a predetermined MRAM cell, a reference MRAM cell in a high resistance state and a reference MRAM cell in a low resistance, are selected. A predefined voltage is applied to the selected cells to generate an output current I from the predetermined MRAM cell, a first reference current I1 from the reference MRAM cell in the high resistance state, and a second reference current I2 from the reference cell in the low resistance state. The averager 118 averages the first reference current I1 and the second reference current I2 to provide a reference current (I1+I2)/2. The sense amplifier 102 then compares the output current I with the reference current, (I1+I2)/2, to provide a digital output, such as a logic "1" or "0."

For example, in a reading operation, word line WL1 that contains the MRAM cell 112, a first reference MRAM cell 114 programmed to "1," and a second reference MRAM cell 116 programmed to "0" is selected. By turning on the NMOS device 108, the output current from the MRAM cell 112 will enter the sense amplifier 102. The reference current, which is the average of the reference currents from the reference MRAM cells 114 and 116, also enters the sense amplifier 102. The sense amplifier 102 compares the output current with the reference current to provide a digital output.

In this example, I1 denotes the reference current from the reference MRAM cell 114, which is in a high resistance state. I2 denotes the reference current from the reference MRAM cell 116, which is in a low resistance state. The average of the reference currents equals (I1+I2)/2. The output current I from the MRAM cell 112 is compared with the average reference current (I1+I2)/2. If the output current I is smaller than (I1+I2)/2, a logic "1" (or "0") will be output from the sense amplifier 102. Normally, when the MRAM cell 114 is in a high resistance state, the value of the output current I is about I1. A sense margin of the sensing circuit 100 is defined as the difference between the output current from the MRAM cell 112 and the average reference current from the averager 118. Algebraically, the sense margin is (I1−I2)/2. When the MRAM cell 114 is in a low resistance state, the value of the output current I is about I2. Algebraically, the sense margin is, again, equal to (I1−I2)/2.

The output current I from the MRAM cell 114 of a high resistance state may deviate significantly from I1, due to reasons, such as process fluctuation. If the deviation exceeds the sense margin (I1−I2)/2, a false reading will occur. Thus, it is desirable to increase the sense margin, so that a wider deviation of the output current I can be tolerated.

Figure 2:
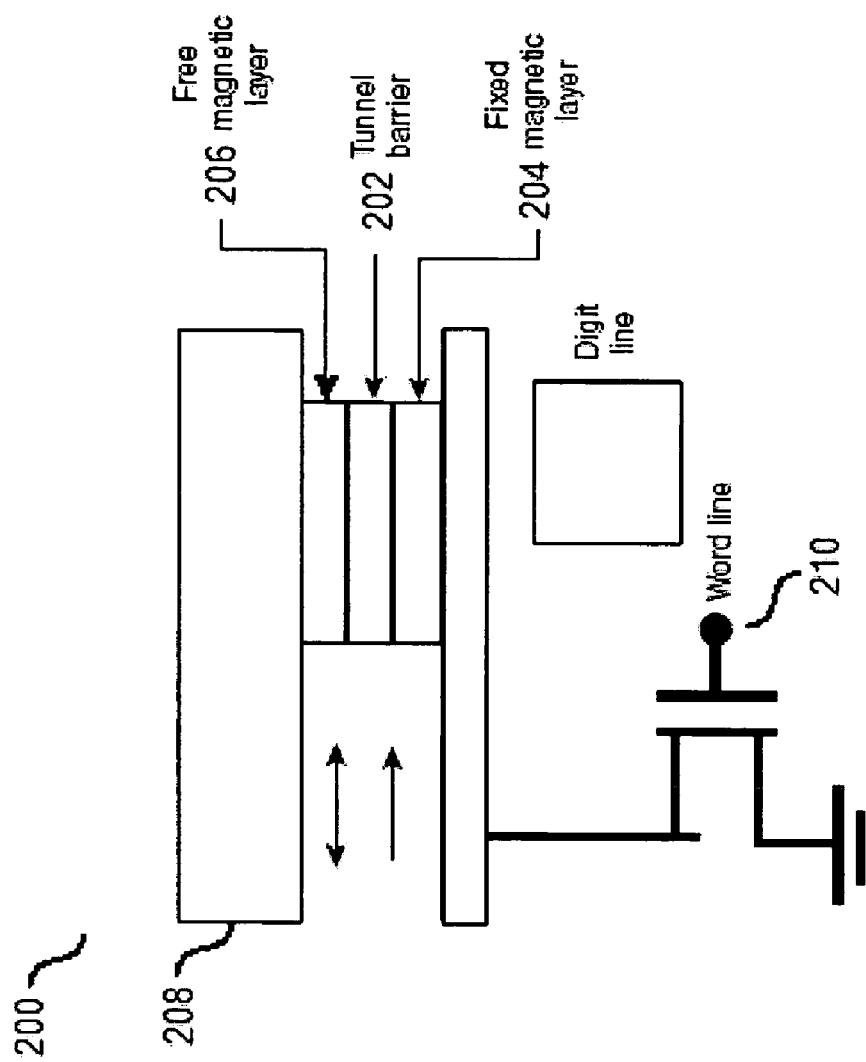
FIG. 2 illustrates a cross-sectional view of a MRAM cell.

FIG. 2 illustrates a cross-sectional view 200 of a magnetic tunnel junction (MTJ) MRAM cell. A typical MTJ MRAM cell includes a layer of insulating material 202 sandwiched between two electrodes of magnetic material. The insulating material 202 is also called a tunneling barrier. One electrode is a fixed ferromagnetic layer 204 that creates a strong pinning field to hold the magnetic polarization thereof in one specific direction. The other electrode is a free ferromagnetic layer 206 which is free to rotate and hold polarization in one of two directions. The free ferromagnetic layer 206 is connected to a top electrode and led to a bit line 208. The fixed ferromagnetic layer 204 is connected to a bottom electrode leading to a word line 210.

Similar to other types of memory cells, the MTJ MRAM cell has a low state and a high state. When the fixed ferromagnetic layer 204 and the free ferromagnetic layer 206 have the same polarization for their magnetic fields, the MTJ MRAM cell will be in a low resistance state. When their polarizations are opposite, the MTJ MRAM cell will be in a high resistance state. The state can be read or detected by having a current flow from one magnetic layer to the other through the insulating material 202.

The high or low resistance state determines the output current from a MRAM cell. Conventionally, a sense amplifier is used to compare the output current with an average reference current. However, as discussed above, the sense margin of the sense amplifier is only one half of the difference between the currents representing the high resistance state and the low resistance state. A process fluctuation in fabricating a MRAM cell can easily send the output current beyond the sense margin. Thus, it is desired to increase the sense margin to improve the reliability when reading the MRAM cells.

Figure 3:
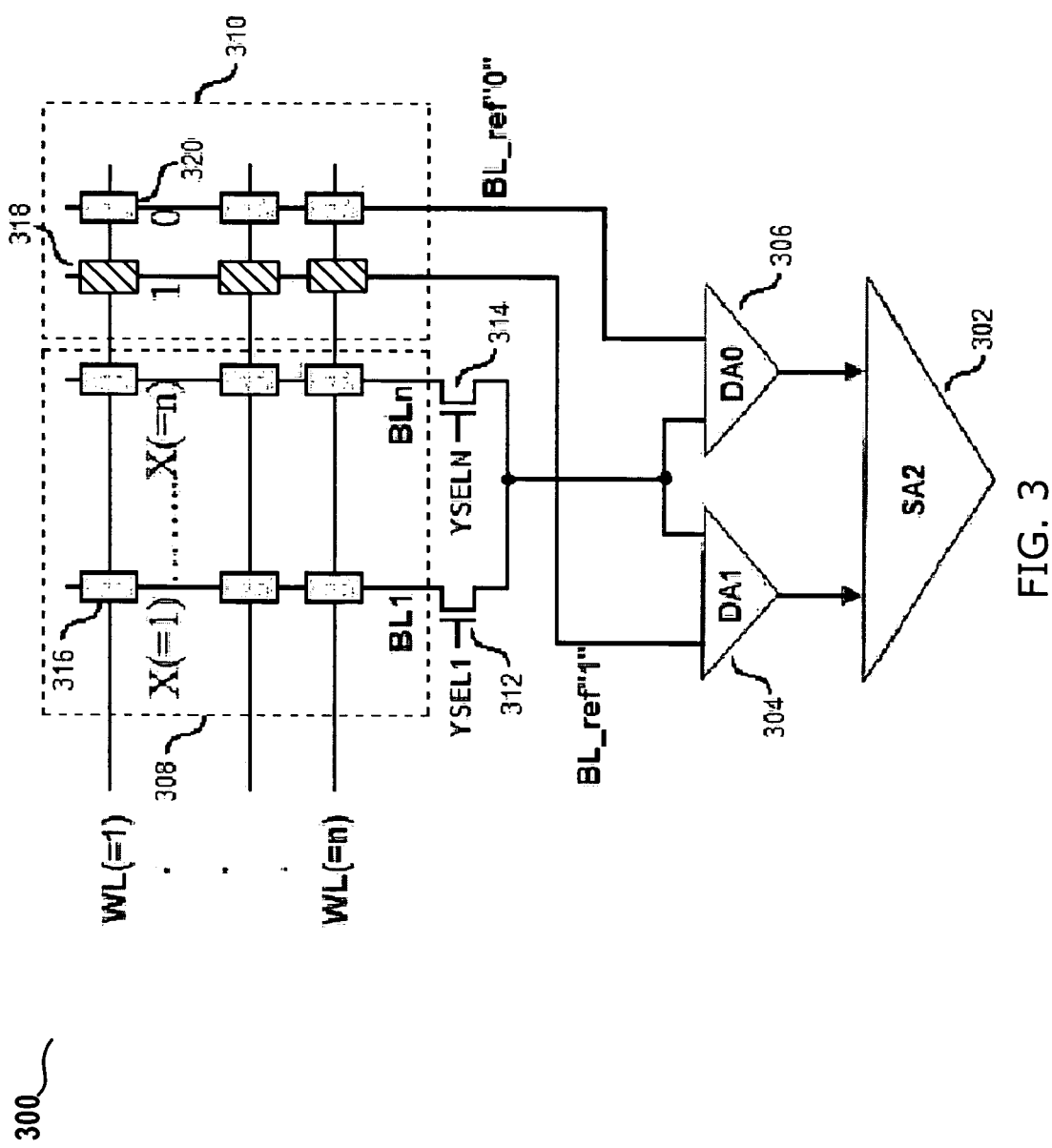
FIG. 3 illustrates a sensing circuit with an improved sense margin in accordance with one embodiment of the present invention.

FIG. 3 illustrates a sensing circuit 300 in accordance with one embodiment of the present invention. A sense amplifier 302 and two differential amplifiers 304 and 306 are coupled to a memory array 308 that has a plurality of MRAM cells and a reference array 310 that has a plurality of reference MRAM cells. The rows of the MRAM cells in the memory array 308 are defined by the word lines WL1 . . . WLn. For each word line WL, the reference array 310 includes at least one reference MRAM cell programmed to "1" and at least one reference MRAM cell programmed to "0." The columns of the MRAM cells in the memory array 308 are defined by the bit lines BL1 . . . BLn. The column of a predetermined MRAM cell in the memory array 308 can be selected with a selection signal on one of the Y-select lines, YSEL1 . . . YSELn, which control select devices, such as NMOS devices 312 and 314.

When reading a MRAM cell 316 that is programmed to "1," the MRAM cell 316, a reference MRAM cell 318 storing "1," and a reference MRAM cell 320 storing "0" will be selected. A predefined voltage is applied to the bit line BL1, a first reference bit line BL_ref"1" that is coupled to a first reference MRAM cell 318, and a second reference bit line BL_ref"0" that is coupled to a second reference MRAM cell 320. The sensing circuit 300 may further include a source follower (not shown in the figure) for clamping the predefined voltage in a range, for example, between 0.3 and 1.0V. Due to the voltage applied, the predetermined MRAM cell 316 generates an output current I, the first reference MRAM cell 318 generates a first reference current I1 reflecting its high resistance state, and the second reference MRAM cell 320 generates a second reference current I2 reflecting its low resistance state.

Differential amplifiers 304 and 306 are coupled to the MRAM cell 316 and the reference MRAM cells 318 and 320 through the bit line, the reference bit lines BL_ref"1" and BL_ref"0," respectively. The differential amplifier 304 subtracts the output current I from the first reference current I1 of the reference MRAM cell 318, or vice versa, to generate a first differential value (I1−I). The second differential amplifier 306 subtracts the second reference current I2 from the output current I, or vice versa, to generate a second differential value (I−I2).

A sense amplifier 302 coupled to the first and second differential amplifiers 304 and 306 compares the first differential value with the second differential value to generate a digital output representing a value stored in the MRAM cell 316. The sense margin, which is defined as the difference between the first differential value (I1−I) and the second differential value (I−I2), equals (I1 +I2)−2I. When the MRAM cell 316 is in a high resistance state, the value of the output current I is about I1. The sense margin becomes (I2−I1). This is twice the magnitude of the sense margin (I1−I2)/2 of a conventional sensing circuit. When the MRAM cell 316 is in a low resistance state, the value of the output current I is about I2. The sense margin becomes (I1−I2). This is, again, twice the magnitude of the sense margin (I1−I2)/2 of a conventional sensing circuit. As a result, the sensing circuit 300 can better tolerate the deviation of the output current I. In other words, the deviation needs to exceed the sense margin (I1−I2) to generate a false reading of the MRAM cell 316.

It is noteworthy that the sense amplifier may include a current mirror load for converting current signals into voltage signals. The invention can apply to not only MRAM cells, but also other memory cells such as phase-change random access memory (PRAM) cells and ferroelectric random access memory (FRAM) cells.

Figure 4A:
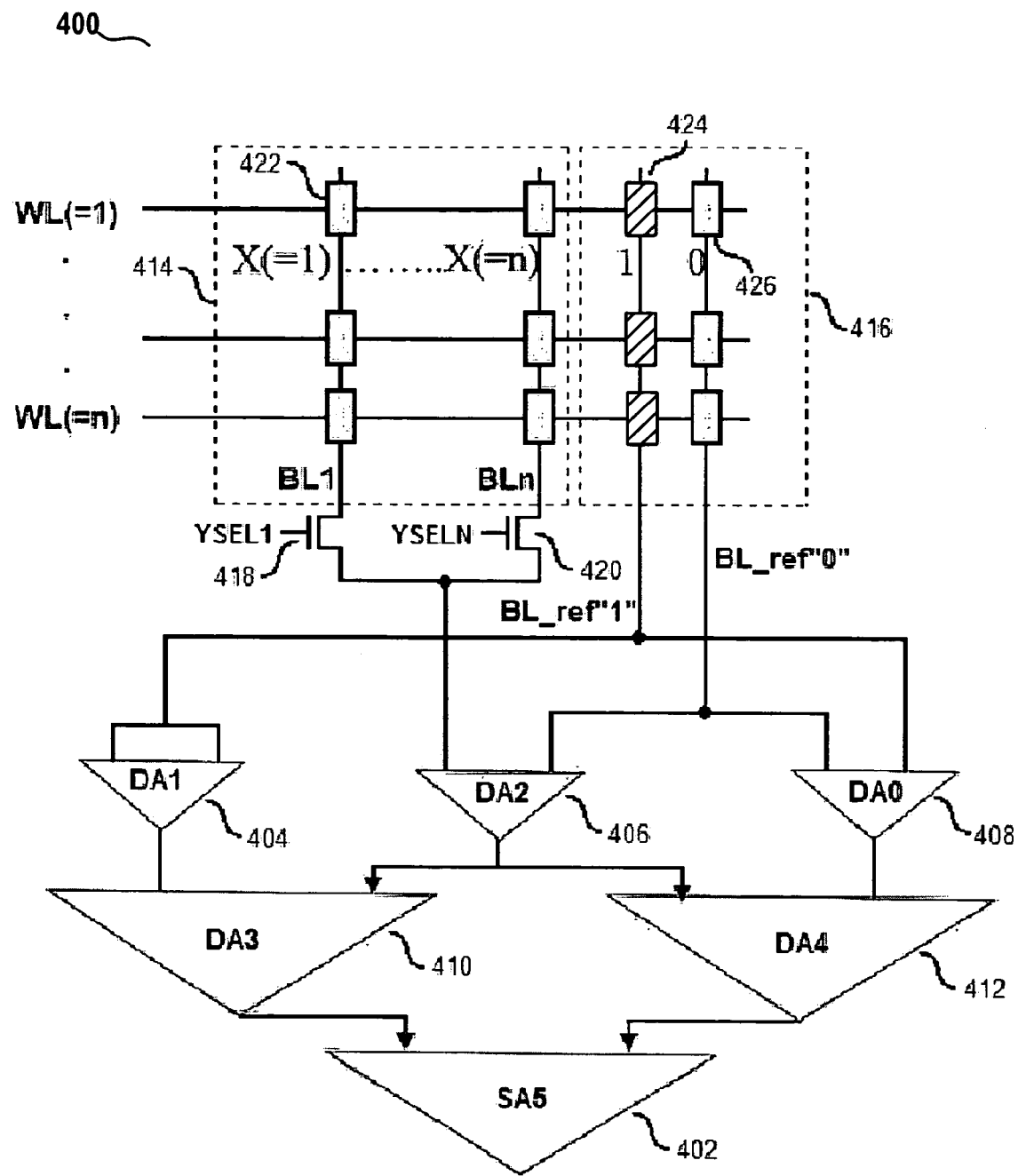
FIG. 4A illustrates a sensing circuit with an improved sense margin in accordance with another embodiment of the present invention.

FIG. 4A illustrates a sensing circuit 400 in accordance with another embodiment of the present invention. The sensing circuit 400 implements a three-stage system wherein a sense amplifier 402 works with five differential amplifiers 404, 406, 408, 410, and 412 to provide an increased sense margin. The differential amplifiers 404, 406, and 408 together form the first stage of amplifiers, while the differential amplifiers 410 and 412 form the second stage of amplifiers with the sense amplifier 402 forming the third stage. The differential amplifier 406 is coupled to a memory array 414 having a plurality of MRAM cells, and a bit line BL_ref"0," which carries a reference current from a reference array 416. The reference array 416 includes at least a reference MRAM cell 424 programmed to "1" and at least a reference MRAM cell 426 programmed to "0" for each word line WL. A row of MRAM cells from the memory array 414 can be selected by a selection signal on the word line WL. A column of a predetermined MRAM cell can be selected with a selection signal from one of the Y-select lines YSEL1 . . . YSELN, which control various select devices, such as NMOS devices 418 and 420. Both input terminals of the differential amplifier 404 are tied to a bit line BL_ref"1," which carries the reference current from the column of reference MRAM cells that are programmed to "1".

When reading a data bit from a predetermined MRAM cell 422, a voltage supply (not shown in the figure) applies a predefined voltage to the bit line that is coupled to the MRAM cell 422, a reference bit line BL_ref"1" that is coupled to a first reference MRAM cell 424 having a high resistance state, and a reference bit line BL_ref"0" coupled to a second reference MRAM cell 426 having a low resistance state. The differential amplifier 404 outputs a logic "0" signal to the differential amplifier 410. The differential amplifier 406 subtracts the reference current on the reference bit line BL_ref"0" from the output current from the MRAM cell 422, or vice versa. The differential amplifier 408 subtracts the reference current on the reference bit line BL_ref"1" from the reference current on the reference bit line BL_ref"0," or vice versa. The differential amplifier 410 of the second stage compares the output of the differential amplifier 404 with the output of the differential amplifier 406, and then outputs a differential value between the output currents of the MRAM cell 422 and the MRAM cell 426. Meanwhile, the differential amplifier 412 compares the output of the differential amplifier 406 with the output of the differential amplifier 408, and then outputs the differential value between the output currents of the MRAM cell 422 and the MRAM 424. The sense amplifier 402 of the third stage compares the two differential values from the differential amplifiers 410 and 412 to provide a digital output representing the value stored in the MRAM cell 422.

The difference between the two differential values equals (I1+I2)−2I where I1 is the reference current from the MRAM cell 424, I2 is the reference current from the MRAM cell 426, and I is the output current from the MRAM cell 422. When the MRAM cell 422 is in a low resistance state, the output current I is about I2. The sense margin of the sensing circuit 400 becomes (I1−I2). This is twice the magnitude of the sense margin (I1−I2)/2 of a conventional sensing circuit. When the MRAM cell 422 is in a high resistance state, the output current I is about I1. The sense margin of the sensing circuit 400 becomes I2−I1. This is, again, twice the magnitude of the sense margin (I1−I2)/2 of a conventional sensing circuit. As such, the sensing circuit 400 can better tolerate the output current deviation than the conventional sensing circuit does.

Figure 4B:
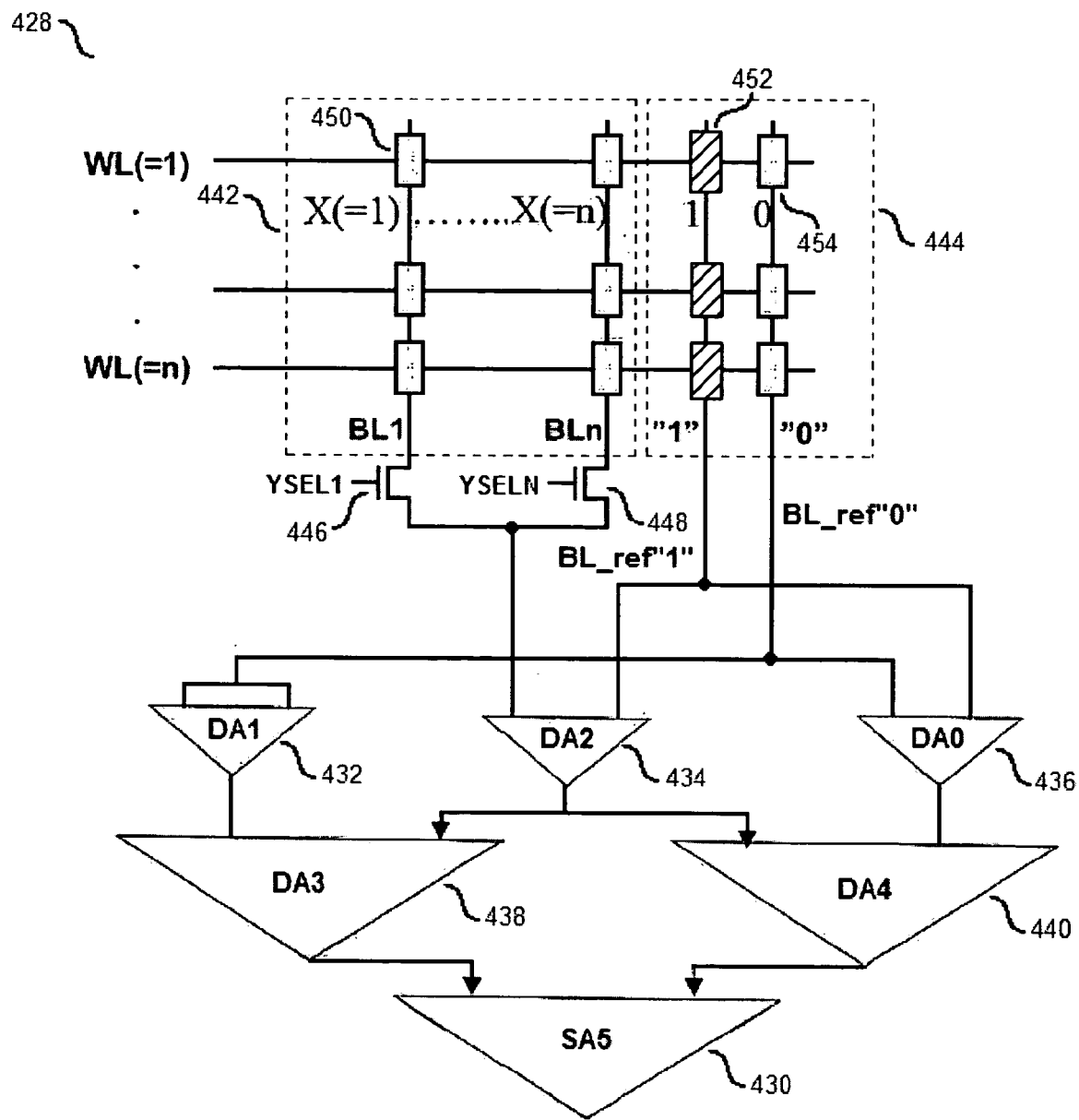
FIG. 4B illustrates a sensing circuit with an improved sense margin in accordance with yet another embodiment of the present invention.

FIG. 4B illustrates a sensing circuit 428 in accordance with another embodiment of the present invention. The sensing circuit 428 implements a three-stage system wherein a sense amplifier 430 works with five differential amplifiers 432, 434, 436, 438, and 440 to provide an increased sense margin. The differential amplifiers 432, 434, and 436 together form the first stage of amplifiers, while the differential amplifiers 438 and 440 form the second stage of amplifiers and the sense amplifier 430 forms the third stage. The differential amplifier 434 is coupled to a memory array 442 having a plurality of MRAM cells, as well as to a bit line BL_ref"1," which carries the reference current from a reference array 444. The reference array 444 includes at least a reference MRAM cell programmed to "1" and at least a reference MRAM cell programmed to "0" for each word line. A row of MRAM cells from the memory array 442 can be selected by a selection signal on the word line WL. A column of a specific MRAM cell can be selected with a selection signal on one of the Y-select lines YSEL1 . . . YSELN, which control various select devices, such as NMOS devices 446 and 448. Both input terminals of the differential amplifier 432 are tied to a bit line BL_ref"0," which carries the reference current from the column of reference MRAM cells within the reference MRAM array 444 that are programmed to "0."

When reading a data bit from a predetermined MRAM cell 450, a voltage supply (not shown in the figure) applies a predefined voltage to the bit line that is coupled to the MRAM cell 450, a reference bit line BL_ref"1" that is coupled to a reference MRAM cell 452 having a high resistance state, and a reference bit line BL_ref"0" coupled to a reference MRAM cell 454 having a low resistance state. The differential amplifier 432 outputs a logic "0" signal to the differential amplifier 438. The differential amplifier 434 subtracts the reference current on the reference bit line BL_ref"1" from the output current from the MRAM cell 450, or vice versa. The differential amplifier 436 subtracts the reference current on the reference bit line BL_ref"1" from the reference current on the reference bit line BL_ref"0," or vice versa. The differential amplifier 438 compares the output of the differential amplifier 432 with the output of the differential amplifier 434 to output a differential value between the output currents of the MRAM cell 450 and the MRAM cell 452. Meanwhile, the differential amplifier 440 compares the output of the differential amplifier 434 with the output of the differential amplifier 436, and outputs the differential value between the output currents of the MRAM cell 450 and the MRAM cell 454. The sense amplifier 430 compares the two differential values from the differential amplifiers 438 and 440 to provide a digital output representing the value stored in the MRAM cell 450.

The difference between the two differential values equals (I1+I2)−2I where I1 is the reference current from the MRAM cell 452, I2 is the reference current from the MRAM cell 454, and I is the output current from the MRAM cell 450. When the MRAM cell 450 is in a low resistance state, the output current I is about I2. The sense margin of the sensing circuit 428 becomes I1−I2. This is twice the magnitude of the sense margin (I1−I2)/2 of a conventional sensing circuit. When the MRAM cell 450 is in a high resistance state, the output current I is about I1. The sense margin of the sensing circuit 428 becomes I2−I1. This is, again, twice the magnitude of the sense margin (I1–I2)/2 of a conventional sensing circuit. As such, the sensing circuit 428 can better tolerate the output current deviation than the conventional sensing circuit does.

This invention provides methods and circuits for sensing MRAM cells with full magneto-resistive ratio by implementing at least 2 stages of amplifiers for the sensing circuits. Two reference MRAM cells, one programmed high and the other programmed low, are used to compare against a selected MRAM cell throughout several stages of amplifiers, thereby increasing the sense margin when MRAM cells are read. Bit-line loading effect can also be self-compensated, while process fluctuation is minimized.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for sensing an output of a predetermined memory cell capable of switching between a high resistance state and a low resistance state, comprising:

applying a predefined voltage to the predetermined memory cell to generate an output current reflecting a resistance of the predetermined memory cell, and to one or more reference memory cells to generate a first reference current reflecting the high resistance state, and a second reference current reflecting the low resistance state;

providing a first differential value representing the difference between the output current and the first reference current, and a second differential value representing the difference between the output current and second reference current; and comparing the first differential value with the second differential value to generate a digital output representing the resistance state of the predetermined memory cell, wherein the step of providing the first and second differential values further comprises:

inputting the first reference current into a first node and a second node of a first differential amplifier;

inputting the output current into a first node of a second differential amplifier, and the second reference current into a second node of the second differential amplifier and inputting the second reference current into a first node of a third differential amplifier, and the first reference current into a second node of the third differential amplifier.

2. The method of claim 1 wherein the step of providing the first and second differential values further comprises:

subtracting an output from the second differential amplifier from an output from the first differential amplifier with a fourth differential amplifier, or vice versa, to generate the second differential value; and subtracting an output from the third differential amplifier from an output from the second differential amplifier with a fifth differential amplifier, or vice versa, to generate the first differential value.

3. The method of claim 1 wherein the comparing further comprises:

inputting the first differential value into a first node of a sense amplifier;

inputting the second differential value into a second node of the sense amplifier; and outputting the digital output from the sense amplifier based on comparison between the first and second differential values.

4. A method for sensing an output of a predetermined memory cell capable of switching between a high resistance state and a low resistance state, comprising:

applying a predefined voltage to the predetermined memory cell to generate an output current reflecting a resistance of the predetermined memory cell, and to one or more reference memory cells to generate a first reference current reflecting the high resistance state, and a second reference current reflecting the low resistance state;

providing a first differential value representing the difference between the output current and the first reference current, and a second differential value representing the difference between the output current and second reference current; and comparing the first differential value with the second differential value to generate a digital output representing the resistance state of the predetermined memory cell, wherein the step of providing the first and second differential values further comprises:

inputting the second reference current into a first node and a second node of a first differential amplifier;

inputting the output current into a first node of a second differential amplifier, and the first reference current into a second node of the second differential amplifier; and inputting the second reference current into a first node of a third differential amplifier, and the first reference current into a second node of the third differential amplifier.

5. The method of claim 4 wherein the step of providing the first and second differential values further comprises:

subtracting an output from the second differential amplifier from an output from the first differential amplifier with a fourth differential amplifier, or vice versa, to generate the first differential value; and subtracting an output from the third differential amplifier from an output from the second differential amplifier with a fifth differential amplifies, or vice versa, to generate the second differential value.

6. A circuit for sensing an output of a predetermined memory cell capable of switching between a high resistance state and a low resistance state, comprising:

one or more reference memory cells coupled to the predetermined memory cell;

a voltage supply for applying a predefined voltage to the predetermined memory cell to generate an output current reflecting a resistance of the predetermined memory cell, and the reference memory cells to generate a first reference current reflecting the high resistance state, and a second reference current reflecting the low resistance state;

a set of one or more differential amplifiers coupled to the predetermined memory cell and the reference memory cells for providing a first differential value representing the difference between the output current and the first reference current, and a second differential value representing the difference between the output current and second reference current; and at least a sense amplifier coupled to the differential amplifiers for comparing the first differential value with the second differential value to generate a digital output representing the resistance state of the predetermined memory cell, wherein the set of the differential amplifiers comprise:

a first differential amplifier for receiving the first reference current and outputting a zero output;

a second differential amplifier for subtracting the second reference current from the output current, or vice versa; and a third differential amplifier for subtracting the first reference current from the second reference car cut, or vice versa.

7. The circuit of claim 6 wherein the set of differential amplifiers further comprise:

a fourth differential amplifier coupled to the first and second differential amplifiers for receiving outputs therefrom to provide the second differential value; and a fifth differential amplifier coupled to the second and third differential amplifiers for receiving outputs therefrom to provide the first differential value.

8. The circuit of claim 6 wherein the predetermined memory cell is a magneto-resistive random access memory (MRAM) cell, phase-change random access memory (PRAM) cell, or ferroelectric random access memory (FRAM) cell.

9. The circuit of claim 6 further comprising a source follower for controlling the power supply to clamp the predefined voltage in a range between 0.3 and 1.0V.

10. The circuit of claim 6 wherein the sense amplifier includes a current mirror load for converting current signals into a voltage signal.

* * * * *